(12) United States Patent
Lee

(10) Patent No.: US 6,174,782 B1
(45) Date of Patent: *Jan. 16, 2001

(54) METHOD OF FABRICATING LOWER ELECTRODE OF CAPACITOR

(75) Inventor: Tong-Hsin Lee, Taipei Hsien (TW)

(73) Assignee: United Microelectronics Corp. (TW)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/406,505

(22) Filed: Sep. 28, 1999

(30) Foreign Application Priority Data

Jun. 22, 1999 (TW) ................................. 88110421

(51) Int. Cl.⁷ ..................................................... H01L 21/20
(52) U.S. Cl. ........................... 438/396; 438/399; 438/638
(58) Field of Search ................................. 438/3, 240, 253, 438/396, 638, 639, 399, 256

(56) References Cited

U.S. PATENT DOCUMENTS

| | | | |
|---|---|---|---|
| 5,741,626 | * 4/1998 | Jain et al. | 438/634 |
| 5,753,547 | * 5/1998 | Ying | 438/253 |
| 5,854,119 | * 12/1998 | Wu et al. | 438/253 |
| 5,981,334 | * 11/1999 | Chien et al. | 438/253 |
| 5,989,954 | * 11/1999 | Lee et al. | 438/253 |
| 5,998,257 | * 12/1999 | Lane et al. | 438/253 |

* cited by examiner

*Primary Examiner*—Tuan H. Nguyen
(74) *Attorney, Agent, or Firm*—Thomas, Kayden, Horstemeyer & Risley, L.L.P.

(57) ABSTRACT

The invention provides a method for fabricating a lower electrode of the capacitor, which method provides a substrate formed with source/drain (S/D) regions. Landing pads are formed on the substrate for connecting to source/drain regions. A dielectric layer is formed on the substrate to cover the landing pads. A stop layer, an insulating layer, and a mask layer are formed in sequence on the dielectric layer. The insulating layer and the mask layer are patterned to form a capacitor opening that exposes the stop layer, followed by forming a spacer on a sidewall of the capacitor opening. With the patterned mask layer and the spacer serving as an etching mask, the stop layer and the dielectric layer are etched in sequence to form a node contact opening which exposes the landing pad, wherein the capacitor opening and the node contact opening form a damascene contact opening. A conformal conducting layer is formed for filling the damascene contact opening, and planarized by CMP. Consequently, the insulating layer is removed by etching to complete the manufacture of lower electrodes of the capacitor.

18 Claims, 13 Drawing Sheets

METHOD OF FABRICATING LOWER ELECTRODE OF CAPACITOR

CROSS-REFERENCE TO RELATED APPLICATION

This application claims the priority benefit of Taiwan application serial no. 88110421, filed Jun. 22, 1999, the full disclosure of which is incorporated herein by reference.

BACKGROUND OF THE INVENTION

1. Field of Invention

The present invention relates to a method for fabricating a DRAM capacitor. More particularly, the present invention relates to a method for fabricating a lower electrode of the capacitor.

2. Description of Related Art

Figure 1A:
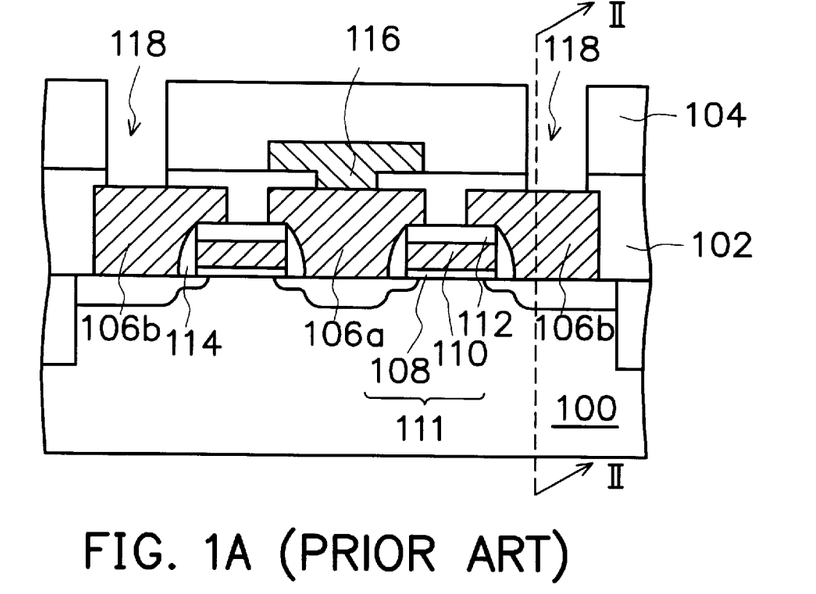
FIGS. 1A to 1C are schematic, cross-sectional diagrams showing the fabrication steps of a lower electrode of a capacitor.
Figure 1B:
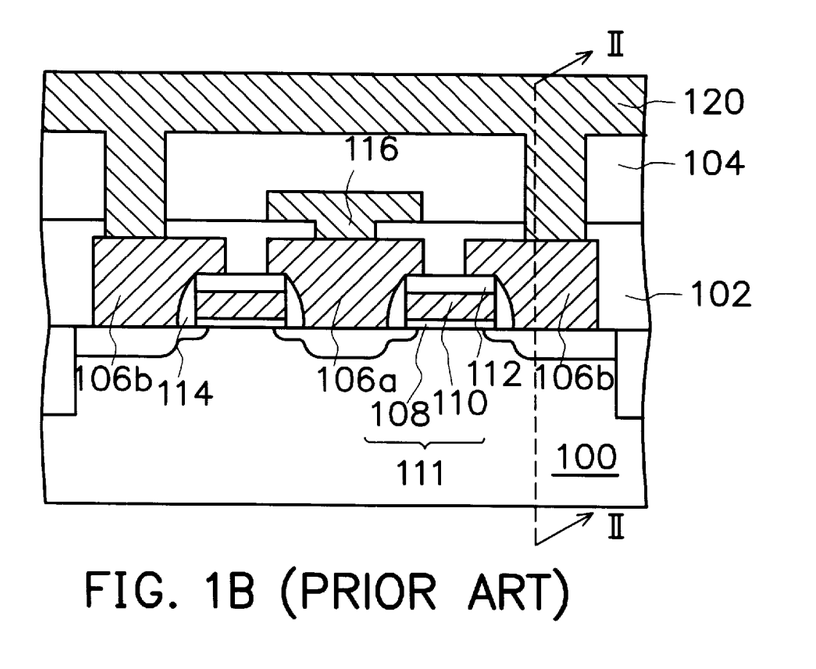
Figure 1C:
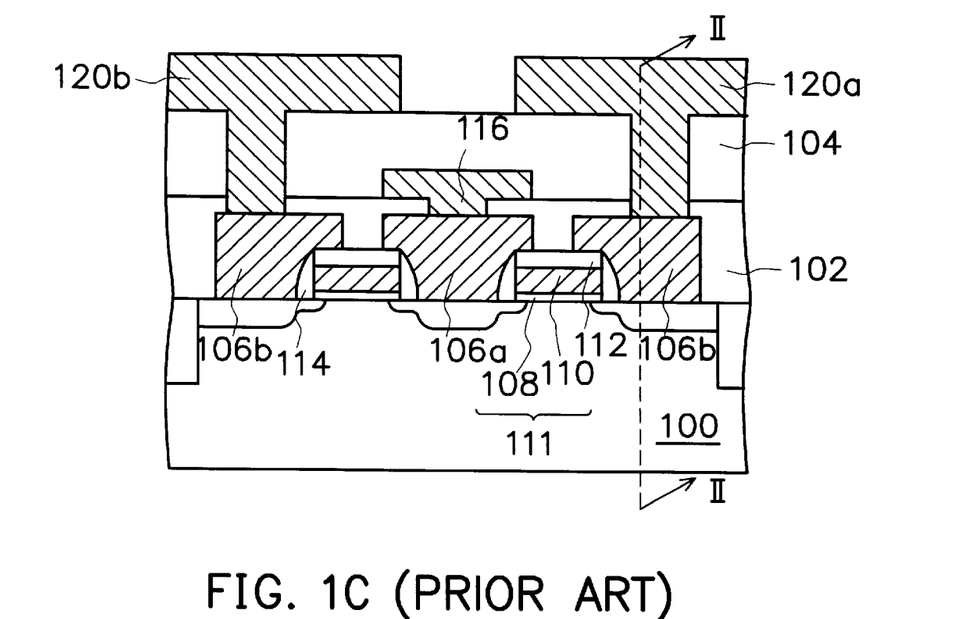
Figure 2A:
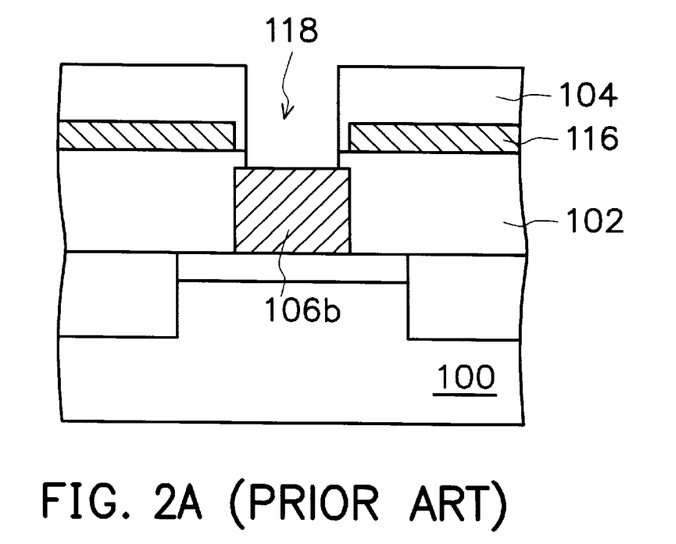
FIGS. 2A to 2C are schematic, cross-sectional diagrams taken at right angle to the first cross-sectional views and bisecting at a line II—II in FIGS. 1A to 1C.
Figure 2B:
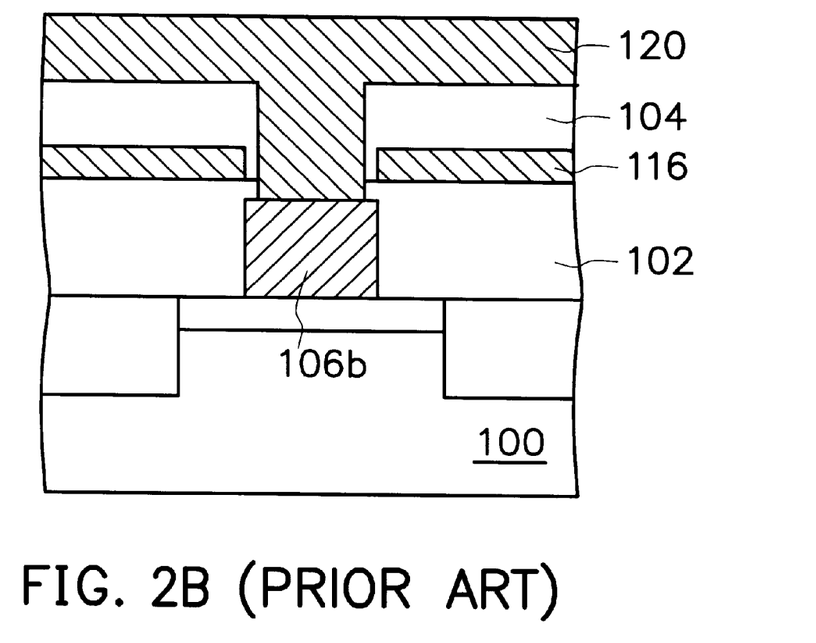
Figure 2C:
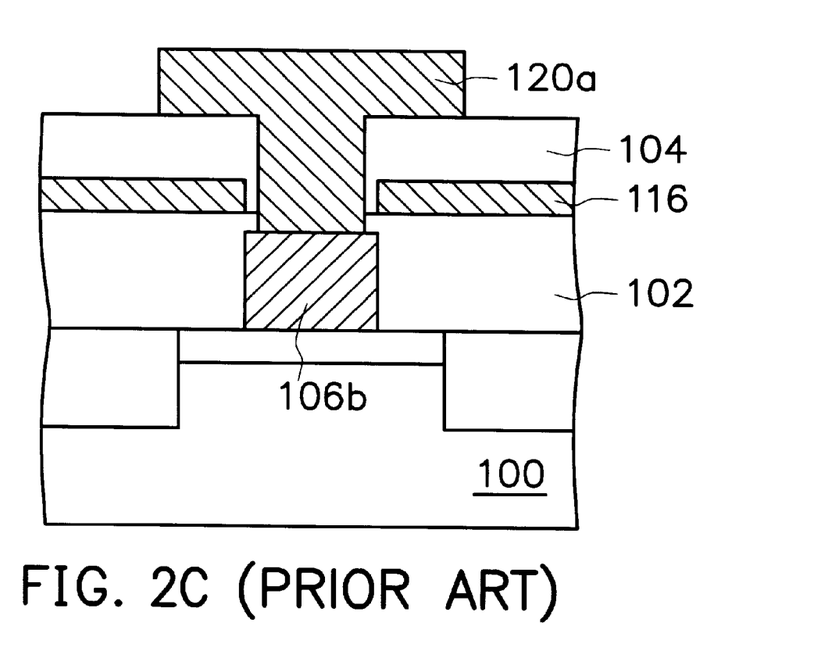

FIGS. 1A to 1C are schematic, cross-sectional diagrams showing the fabrication steps of a lower electrode of a capacitor, while FIGS. 2A to 2C are schematic, cross-sectional diagrams taken at right angle to the first cross-sectional views and bisecting at a line II—II in FIGS. 1A to 1C.

Referring to FIG. 1A and FIG. 2A, a substrate 100 is provided with isolation structures formed therein. A gate 111 is then formed on the substrate 100, wherein the gate 111 is constituted by stacking a gate oxide layer 108, a conducting layer such as a polysilicon layer or a tungsten silicide layer, and a cap layer 112 in sequence on the substrate 100. A spacer 114 is formed on a sidewall of the gate 111 before forming a source/drain (S/D) region by doping in the substrate 100. Landing pads 106a and 106b are formed to couple with the S/D region. A patterned first dielectric layer 102 is formed to cover, a part of the landing pads 106a, 106b, the exposed cap layer 112, and the substrate 100.

Further referring to FIG. 1A and FIG. 2A, a bit line 116 is formed to cover the landing pad 106a and a part of the dielectric layer 102 before forming a second dielectric layer 104 on the first dielectric layer 102. An etching step is performed to form a contact opening 118, which extends through the second dielectric layer 104 and the first dielectric layer 102 to expose the landing pads 106b.

Referring to FIG. 1B and FIG. 2B, a doped polysilicon layer 120 is formed to fill the contact opening 118 and covers the second dielectric layer 104.

Referring to FIG. 1C and FIG. 2C, the doped polysilicon layer 120 is patterned to form a first storage node 120a and a second storage node 120b, which serve as lower electrodes of a capacitor.

The contact opening 118 formed by the conventional process may easily expose the bit line when a misalignment occurs during the contact formation. As a result, a doped polysilicon layer that is subsequently deposited in the contact opening makes contact with the exposed bit line, leading to an electrical short circuit and a damage to the semiconductor device.

With the increased integration for the integrated circuit, the problem mentioned above gets worse as a gap width between the sidewall of the contact opening and the bit line has gradually decreased to, for example about 0.05 microns. One solution for above problem is to increase the gap width between the sidewall of the contact opening and the bit line. An increase in gap width is commonly achieved by decreasing the size of the contact opening. Since the contact opening manufactured by photolithography has a size limitation, only the narrow gap is formed as a consequence.

If the gap between the contact and the bit line is too narrow, the doped polysilicon layer that fills the contact opening may form an unnecessary contact with the bit lines when misalignment occurs, leading to the electrical short circuit.

Conventionally, an increase in the storage charge of the capacitor is achieved by increasing the surface area of a lower electrode. So, a thicker doped polysilicon layer is usually formed for manufacturing the lower electrode. As there is a very small gap in between two adjacent capacitors, it is not easy to completely etch through the thicker doped polysilicon layer for separating two adjacent capacitors, due to a large aspect ratio of the thick doped polysilicon layer.

SUMMARY OF THE INVENTION

The invention provides a method for fabricating a lower electrode of a capacitor, which method provides a substrate, on which forms landing pads and gates, wherein the landing pads are connected to a source/drain region of the substrate. A first dielectric layer is formed to cover the landing pads and the gates and is patterned to form an opening. The opening is filled with a bit line, before forming a second dielectric layer which cover the bit line and the first dielectric layer. A stop layer, an insulating layer, and a mask layer are formed in sequence on the second dielectric layer. The insulating layer and the mask layer are patterned to form a capacitor opening that exposes the stop layer, followed by forming a spacer on a sidewall of the capacitor opening. With the patterned mask layer and the spacer serving as an etching mask, the stop layer, the second dielectric layer and the first dielectric layer are etched in sequence to form a node contact opening which exposes the landing pad. The capacitor opening and the node contact opening form a damascene contact opening, while the damascene contact opening is filled with a conformal conducting layer. The conducting layer is then planarized by chemical mechanical polishing (CMP) to form two separate storage capacitors.

As embodied and broadly described herein, the invention provides a spacer that overcomes the size limitation imposed by using photolithography, so that the bit line is not exposed by the damascene contact opening described above. Also, the conducting layer is planarized by CMP to form the storage capacitors, so use of mask for photolithography is reduced in the invention. Thus, the steps involved in the process are simplified and the process cost is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 3A to 3I are schematic, cross-sectional diagrams showing the steps for fabricating a lower electrode of a capacitor according to the present invention. FIGS. 4A to 4I are schematic, cross-sectional diagrams taken at right angle to the first cross-sectional views and bisecting at a line IV—IV in FIGS. 3A to 3I.

Figure 3A:
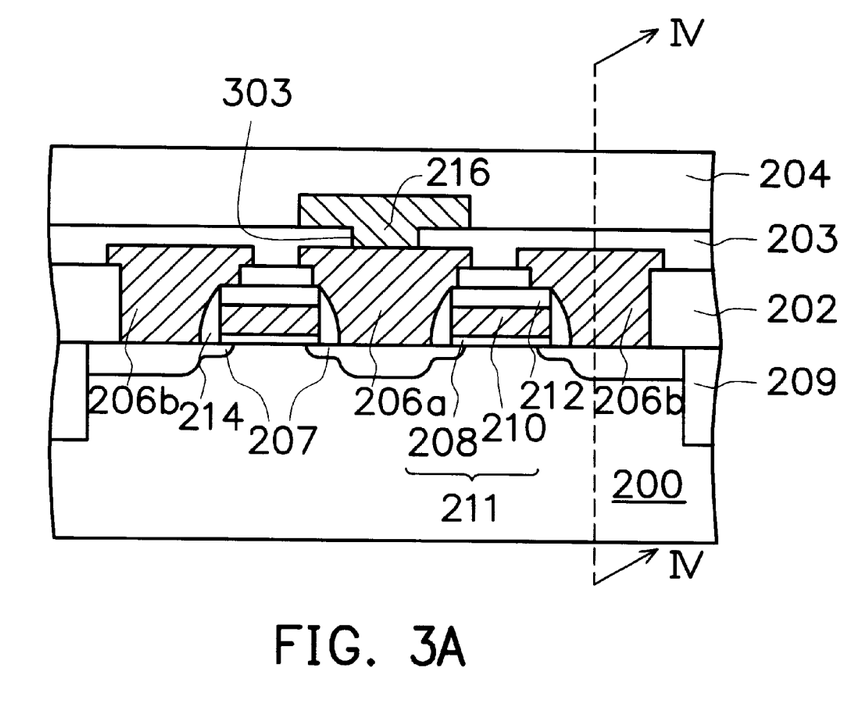
FIGS. 3A to 3I are schematic, cross-sectional diagrams showing the fabrication steps of a lower electrode of a capacitor according to the present invention.
Figure 4A:
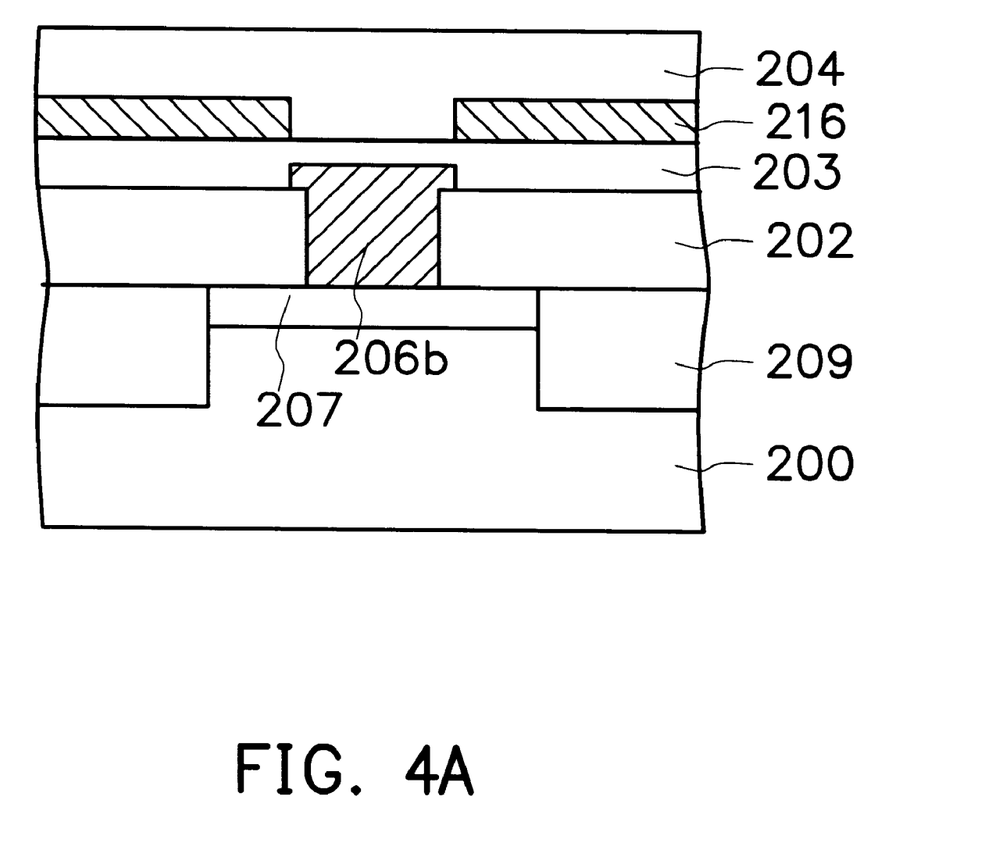
FIGS. 4A to 4I are schematic, cross-sectional diagrams taken at right angle to the first cross-sectional views and bisecting at a line IV—IV in FIGS. 3A to 3I.

Referring to both FIG. 3A and FIG. 4A, a substrate 200 is provided with isolation structures 209 to define active regions of the substrate 200. Gates 211 are formed on the substrate 200, wherein each gate 211 is constituted by stacking a gate oxide layer 208, a conducting layer 210, such as a polysilicon layer or a tungsten silicide layer, and a cap layer 212 in sequence on the substrate 200. A spacer 214 is formed on either side the gate 211, followed by forming source/drain (S/D) regions 207 by doping in the substrate 200. A patterned dielectric layer 202 is formed to partially cover the cap layer 212 and the substrate 200, so that the S/D regions are exposed. Several landing pads 206a, 206b are formed to cover the exposed surface of the substrate 200 and a part of the dielectric layer 202, so that the landing pads 206a, 206b connect to the S/D regions 207.

A dielectric layer 203 is formed to cover the landing pads 206a, 206b and the dielectric layer 202, wherein the dielectric layer 203 is patterned to form an opening 303 which exposes the landing pad 206a between the gates 211. The dielectric layers 202, 203 in this case may include silicon oxide formed by CVD.

A bit line 216 is formed to fill the opening 303 and cover a part of the dielectric layer 203, wherein the bit line 216 may include polysilicon or polycide. A dielectric layer 204 is formed to cover the dielectric layer 203 and the bit line 216. The dielectric layer 204 is made of oxide, and preferably silicon oxide. As shown in FIG. 4A, the bit line 216 is patterned such that the bit lines 216 do not cover the landing pad 206b. Also, a portion of the dielectric layer 204 formed between the bit lines 216, as well as the dielectric layer 203 directly on the landing pad 206b may serve to form a node contact opening subsequently.

It is necessary to emphasize that the devices or layers formed on the substrate 200 as described are exemplary and are not intended to limit the scope of the invention. The dielectric layer 202, the bit lines 216, and the landing pads 206b are particularly noted from these examples. It will be apparent to the skilled in the art that various modifications and variations can be made to other devices or layers without departing from the scope or spirit of the invention.

Figure 3B:
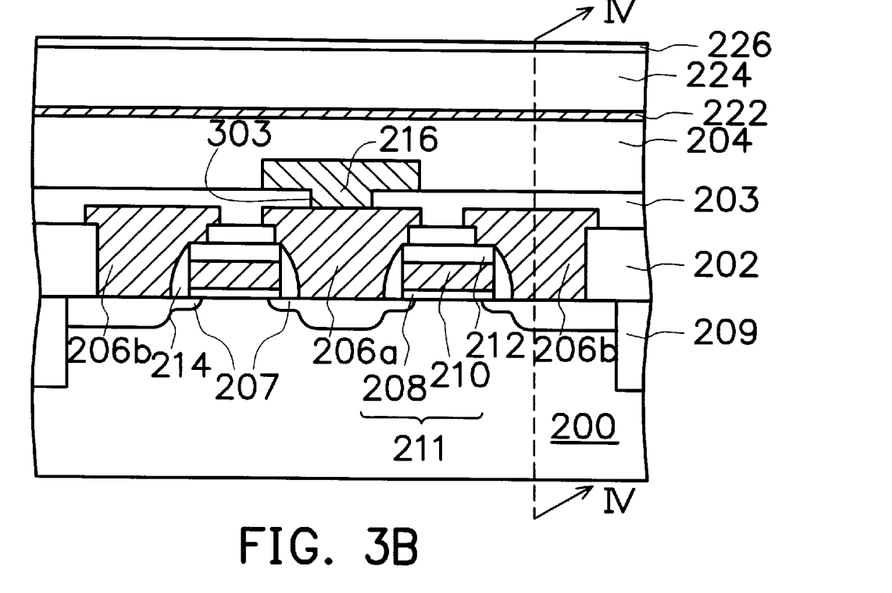
Figure 4B:
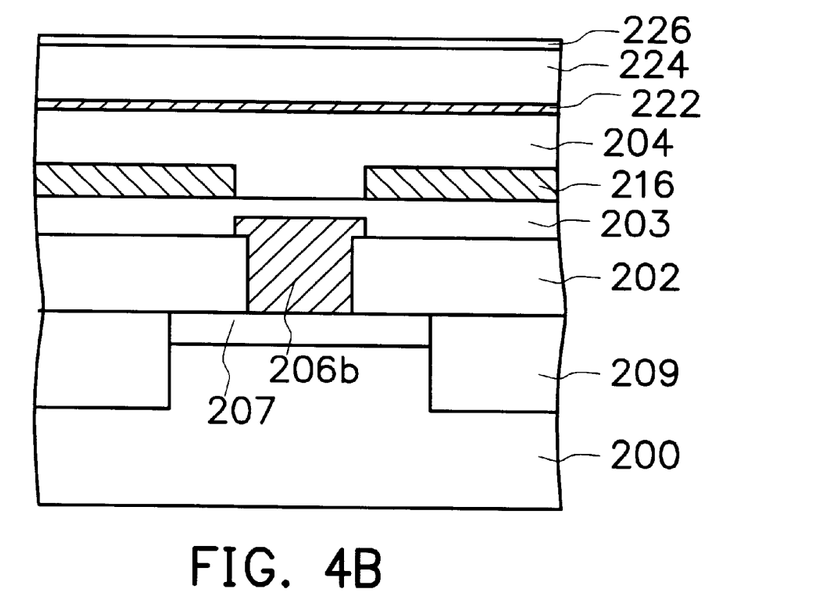

Referring to FIG. 3B and FIG. 4B, a stop layer 222, an insulating layer 224, and a mask layer 226 are formed in sequence on the third dielectric layer 204, wherein the stop layer 222, the insulating layer 224, and the mask layer 226 have different etching rates from etch other. The stop layer 222 may include a doped polysilicon layer formed by process, such as chemical vapor deposition (CVD). The stop layer 222 in this case has a thickness of about 100–200 Å and protects structures underneath it from being etched in the subsequent process. The insulating layer 224 may include oxide, and preferably silicon oxide formed by the process, such as (CVD, while the mask layer 226 may include nitride, and preferably silicon nitride formed by CVD.

Figure 3C:
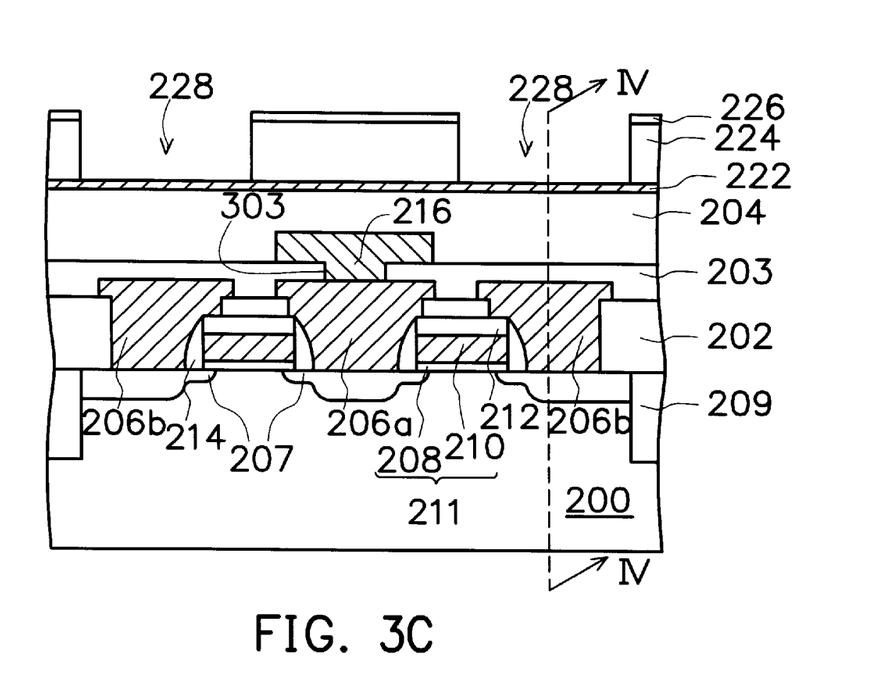
Figure 4C:
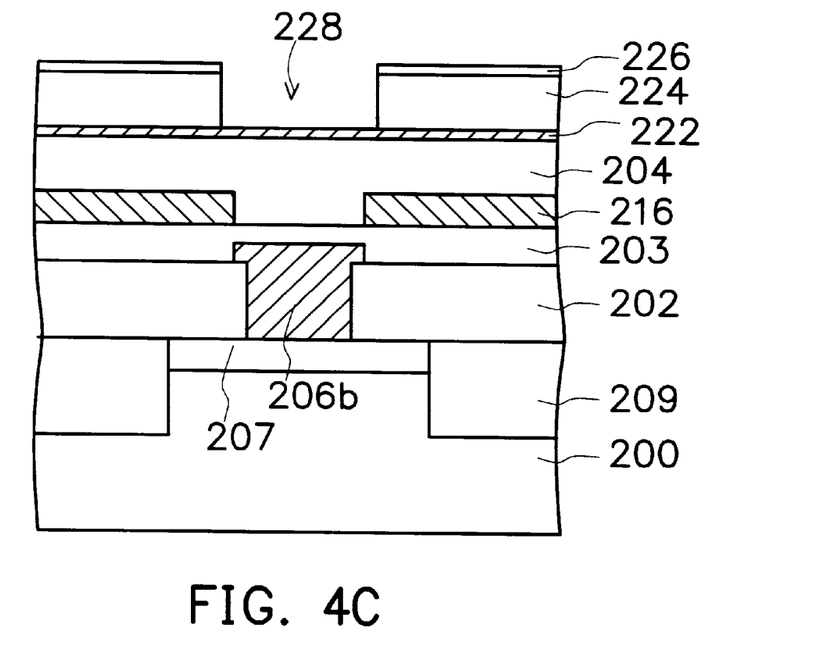

Referring to FIG. 3C and FIG. 4C, the insulating layer 224 and the mask layer 226 are patterned to form a capacitor opening 228, with the stop layer 222 serving as an protective layer.

Figure 3D:
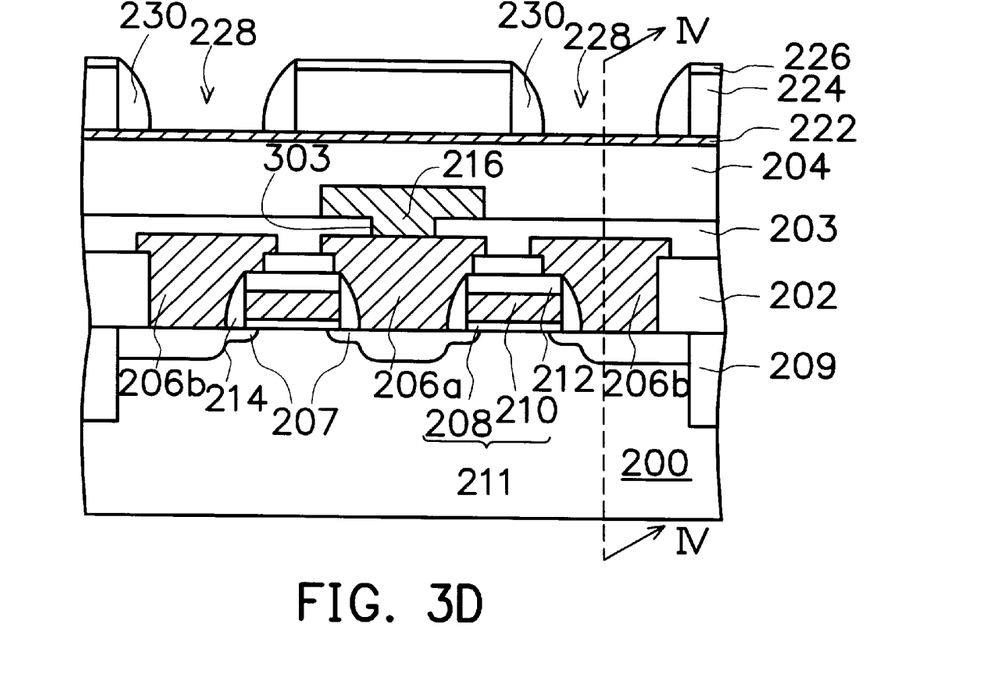
Figure 4D:
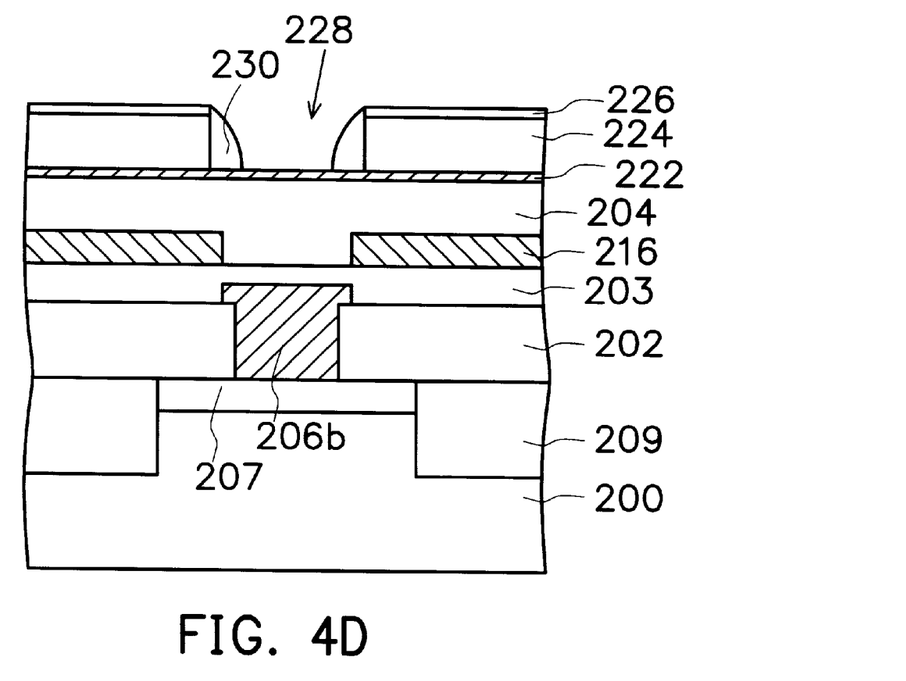

Referring to FIG. 3D and FIG. 4D, a spacer 230 is formed on the sidewall of the capacitor opening 228. The spacer 230 is made of nitride, and preferably silicon nitride, so it has a different etching rate from the stop layer 222, and the dielectric layers 203, 204. The method for forming the spacer 230 involves forming a silicon nitride layer (not shown) which covers the stop layer 222 and fills the capacitor opening 228. The silicon nitride layer is then etched back to form the spacer 230.

Figure 3E:
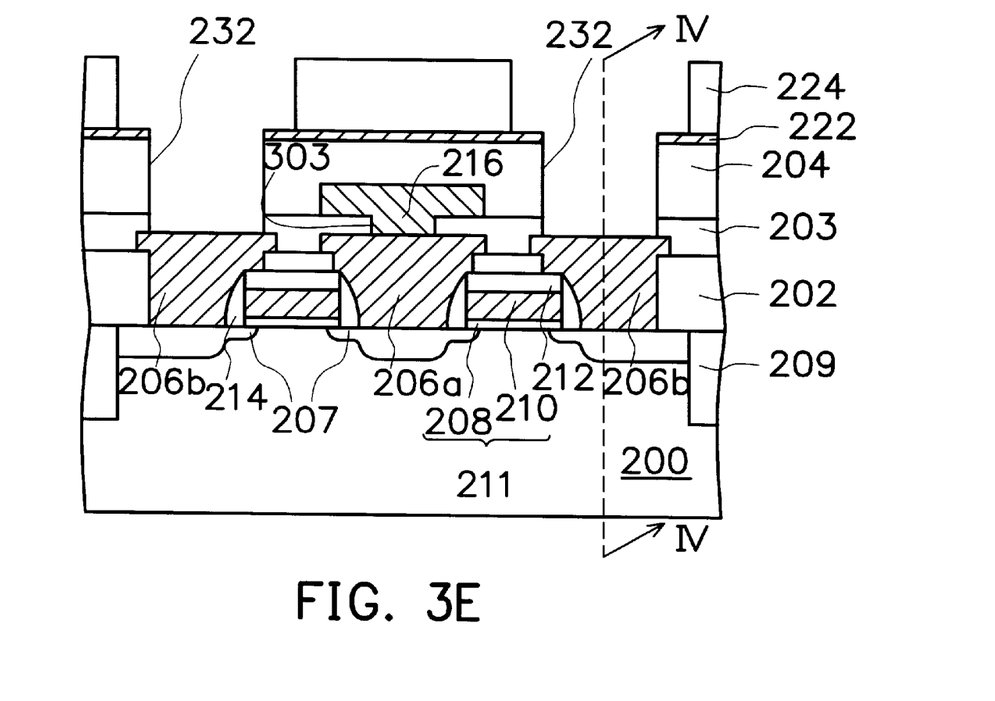
Figure 4E:
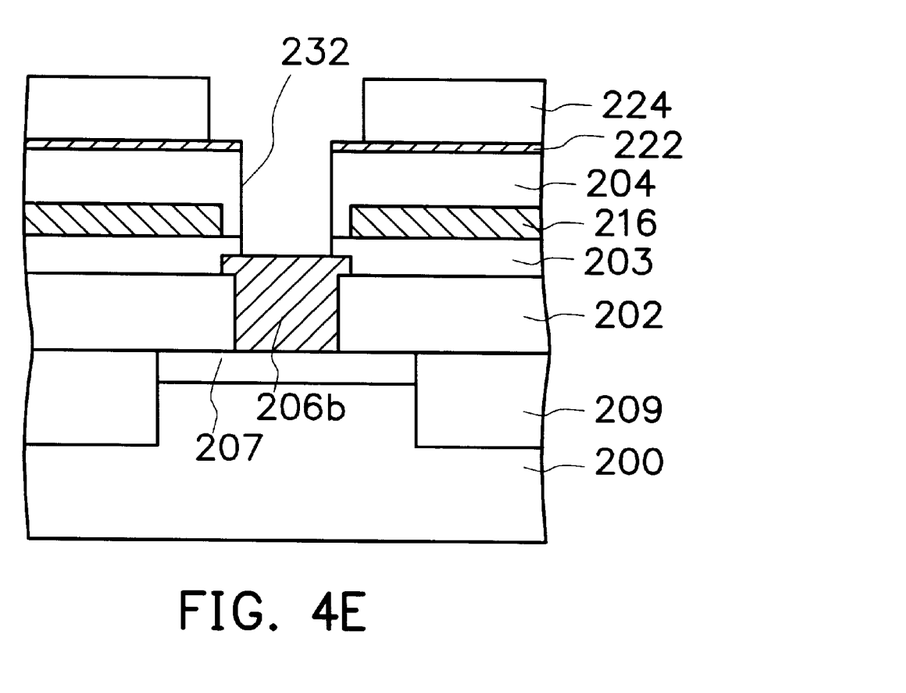

Referring to FIG. 3E and FIG. 4E, the stop layer 222, the dielectric layers 204, 202 are etched, with the mask layer 226 and the spacer 230 serving as an etching mask in order to protect the insulating layer 224 from being etched. As a result, the node contact opening 232, which exposes the conducting structure 206b, is formed by a process such as self-aligned contact (SAC) etching. The spacer 230 and the mask layer 226 are removed as shown. Here, the node contact opening 232 is located between the bit lines 216 but does not expose the bit lines 216. The node contact opening 232 and the capacitor opening 228 form a damascene contact opening, which exposes the landing pad 206b.

Although the photolithography limits the size of the node contact opening 232 during formation of the storage capacitor, such size limitation can be overcome by using spacer 230. Since the size of the node contact opening 232 is determined by the size of the capacitor opening 228 and the thickness of the spacer 230, the node contact opening 232 does not expose the bit line 216 even when the problem such as misalignment occurs.

In addition, the mask layer 226 and the spacer 230 are made of silicon nitride, and therefore may be removed by using $H_3PO_4$ solution.

Figure 3F:
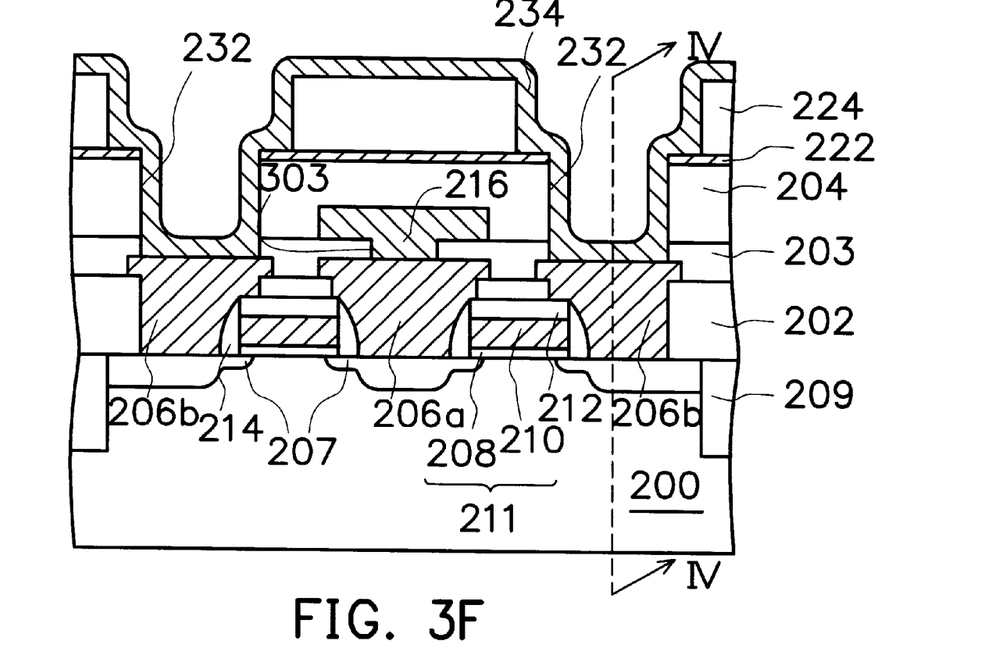
Figure 4F:
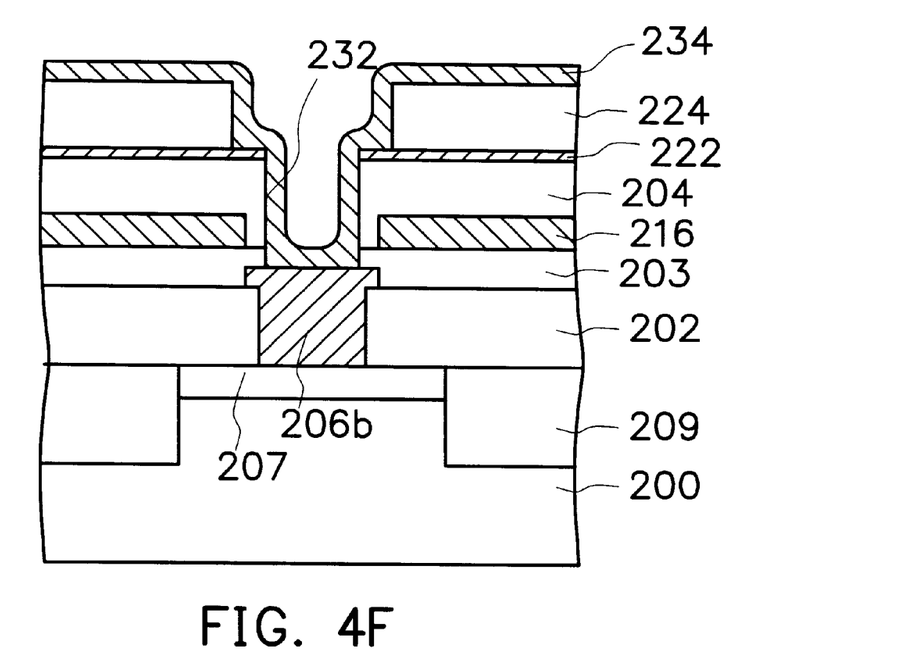

Referring to FIG. 3F and FIG. 4F, a conducting layer 234 is formed to conform to the profile of the damascene contact opening and the insulating layer 224, wherein the conducting layer 234 includes materials such as polysilicon, hemisphere grain (HSG) silicon, or metal.

Figure 3G:
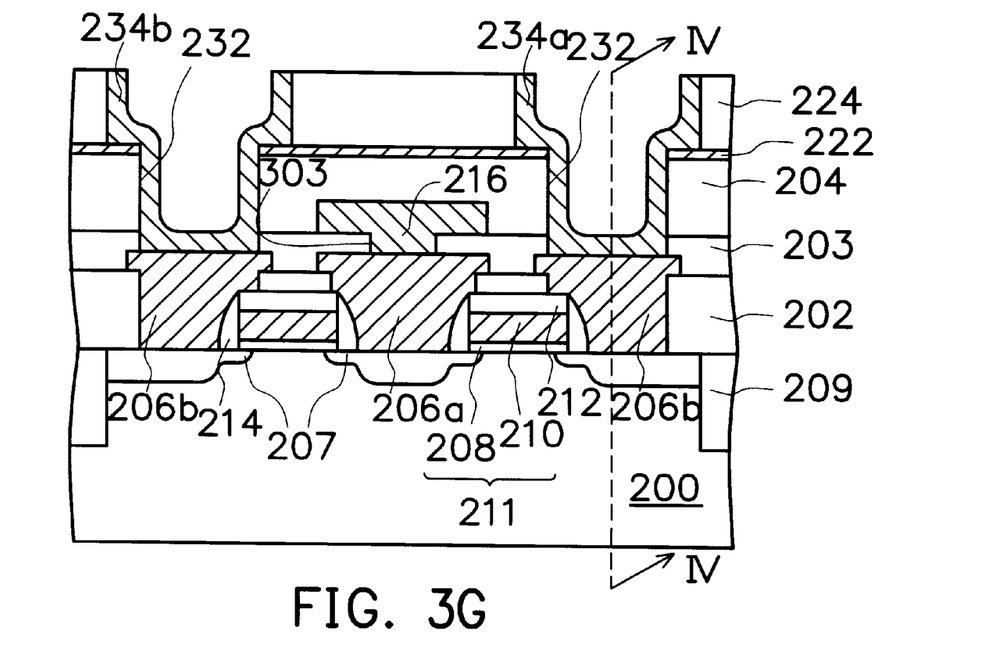
Figure 4G:
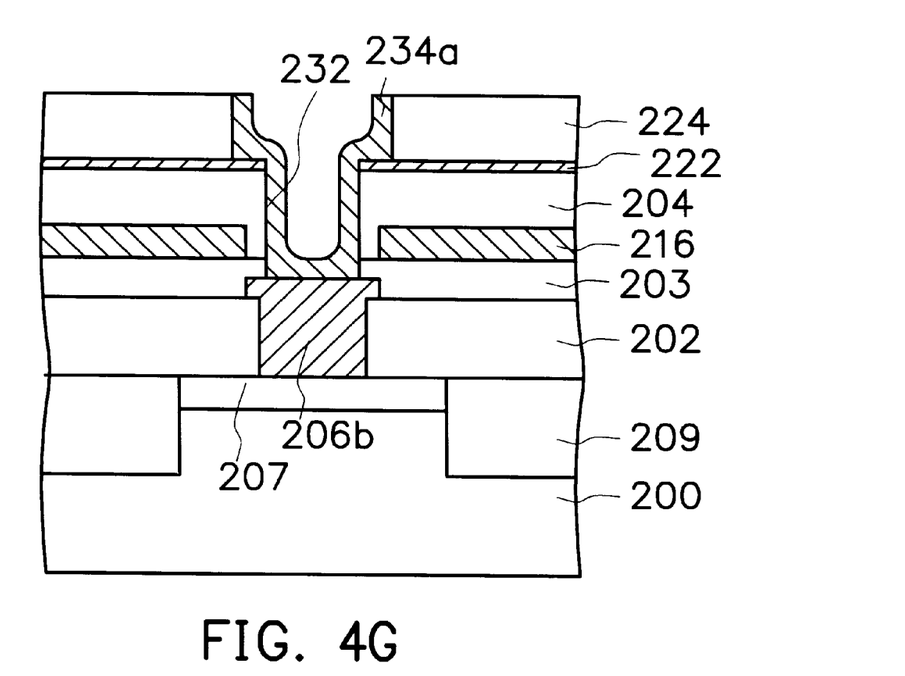

Referring to FIG. 3G and FIG. 4G, the conducting layer 234 above the insulating layer 224 is removed to form two insulating electrodes 234a, 234b which serve as storage nodes of the capacitor. The method for removing the conducting layer 234 involves CMP. A larger surface area of the storage capacitor is obtained because the storage capacitor is formed to have a dual damascene structure. This indicates the sidewall of the node contact opening constitutes a part of the lower electrode of the capacitor, so that the capacitance is increased.

The fabrication method of the electrodes provided is only exemplary and is not intended to limit the scope of the invention. Since storage capacitors are formed by CMP, instead of the conventional photolithography and etching, two adjacent capacitors can be completely separated in the capacitor manufacture process. Also, the conducting layer is planarized by CMP to form the storage capacitors, so use of mask for photolithography is reduced in the invention. Thus, the steps involved in the process are simplified and the process cost is reduced.

Figure 3H:
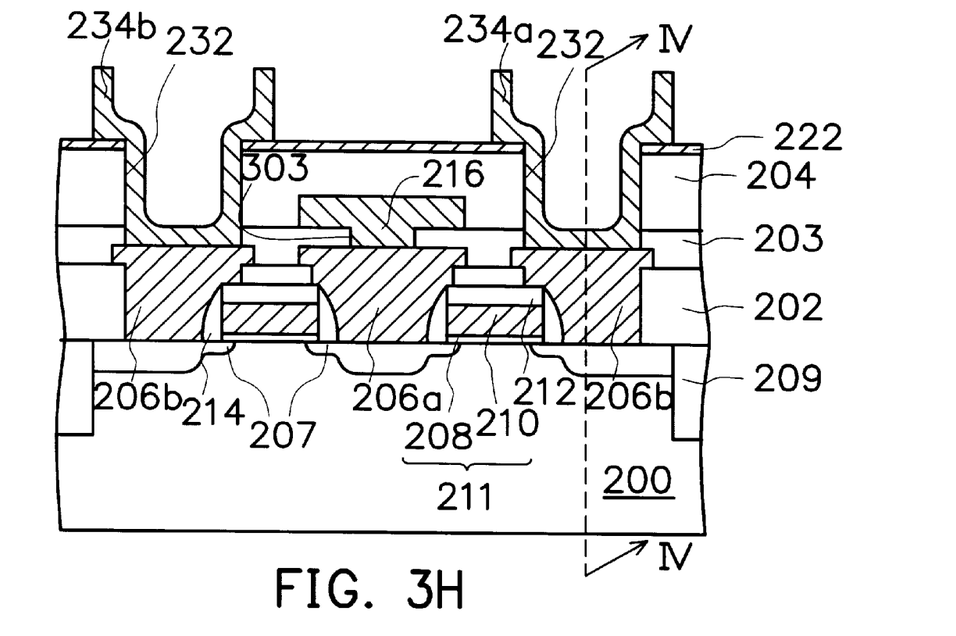
Figure 4H:
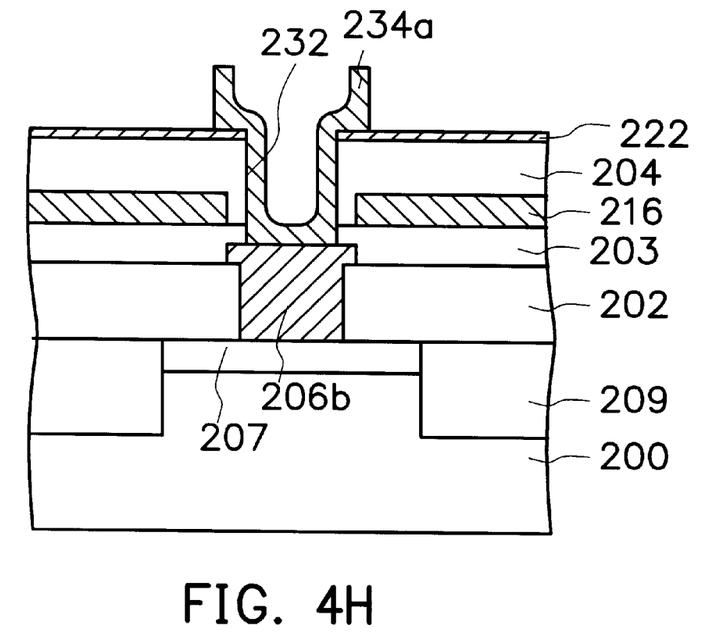

Referring to FIG. 3H and FIG. 4H, the insulating layer 224 is removed using a buffer of etching (BOE) solution, with the stop layer 222 serving as a protective layer.

Figure 3I:
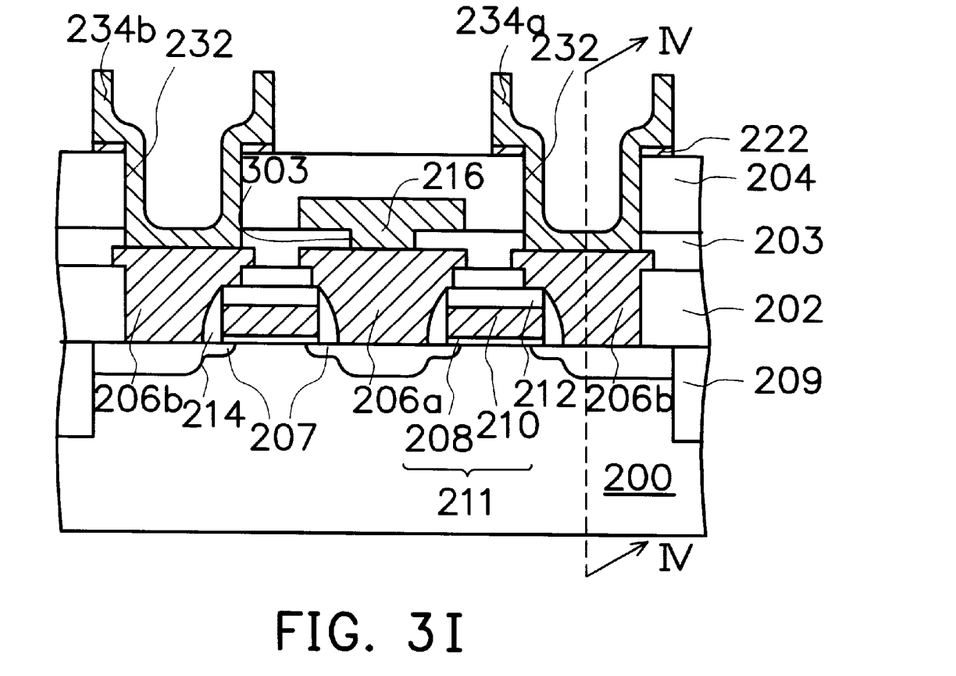
Figure 4I:
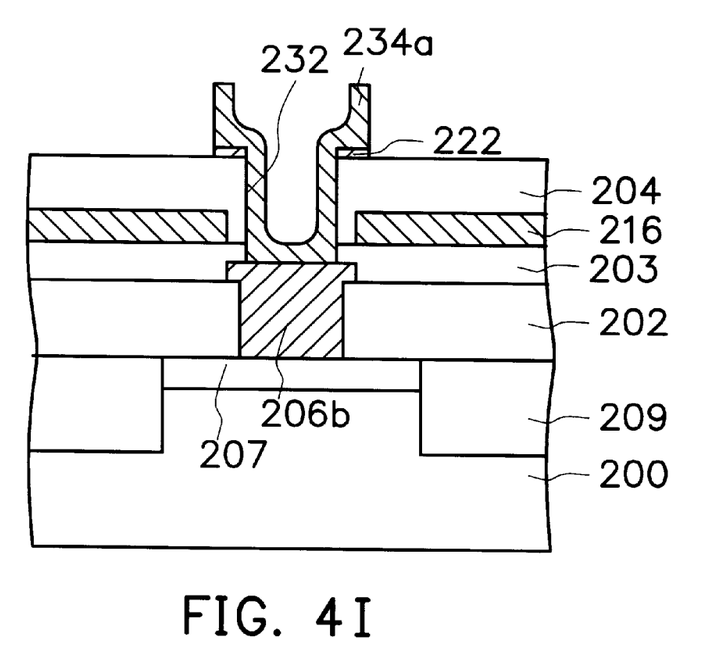

Referring to FIG. 3I and FIG. 4I, the stop layer 222 not covered by the conducting layers 234a, 234b is removed to ensure that the electrodes are well isolated from each other, if the stop layer is a conductive layer. The lower electrodes of the capacitor are composed of a part of the stop layer 222 and conformal conducting layers 234a, 234b. The step for removing the stop layer 222 may involve dry etching, with the conducting layers 234a, 234b serving as the etching masks. However, if the stop layer 222 is a dielectric layer, no further etching step is required to separate adjacent electrode from each other.

Summarizing the above, it is understood that the node contact opening in the invention is formed by a self-aligned contact process with a spacer forming on the sidewall of the capacitor opening, so as to increase the process window. Therefore, the node contact opening does not expose the bit line when misalignment occurs during formation of the storage capacitor. Furthermore, the node contact opening is included as a part of the storage capacitor profile, so the node contact is formed during formation of the storage capacitor. Since storage capacitors are formed and separated by CMP, instead of the conventional photolithography and etching, use of mask for photolithography is reduced in the invention, while complete etching required for separating two adjacent capacitors are longer problems in the capacitor manufacture process. Thus, the steps involved in the process are simplified and the process cost is reduced. In addition, a larger surface area of the storage capacitor is obtained because the storage capacitor opening is formed to have a dual damascene structure. This indicates the sidewall of the capacitor opening constitutes a part of the lower electrode, so the capacitance is increased. Moreover, as size of the node contact opening is determined by size of the capacitor opening and thickness of the nitride spacer, the node contact opening does not expose the bit line even when misalignment occurs.

It will be apparent to the skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a lower method of the capacitor, the method comprising:

providing a substrate with gates and source/drain (S/D) regions;

forming landing pads on the substrate for connecting to the S/D regions;

forming a first dielectric layer on the substrate;

forming in sequence a stop layer, an insulating layer, and a mask layer on the first dielectric layer;

patterning the insulating layer and the mask layer, so that a capacitor opening is formed to expose the stop layer;

forming a spacer on a sidewall of the capacitor opening;

performing a self-aligned etching process to remove the stop layer and the first dielectric layer, with the mask layer and the spacer serving as an etching mask, so that a node contact opening which exposes the landing pad is formed, wherein the capacitor opening and the node contact opening forms a damascene contact opening, and sizes of the spacer and the capacitor opening determine a size of the node contact opening;

removing the mask layer and the spacer until the insulating layer is exposed;

forming a conformal conducting layer to cover the damascene contact opening;

performing chemical mechanical polishing (CMP) to remove the conducting layer on the insulating layer; and removing the insulating layer so as to complete the manufacture of the lower electrode of the capacitor.

2. The fabrication method of claim 1, wherein the stop layer has a different etching rate from the insulating layer and the mask layer.

3. The fabrication method of claim 1, wherein the method for forming the spacer includes deposition of a nitride layer for covering the mask layer and the exposed stop layer, followed by performing an etching back for forming a nitride spacer.

4. The fabrication method of claim 1, wherein a $H_3PO_4$ solution is included in the step for removing the mask layer and the spacer.

5. The fabrication method of claim 1, further comprises forming a second dielectric layer that covers the S/D regions and the gates before formation of the landing pad.

6. The fabrication method of claim 1, further comprises forming a third dielectric layer that covers the landing pads and the second dielectric layer after formation of the landing pad.

7. The fabrication method of claim 1, further comprises removing the stop layer uncovered by the conducting layer, so that two adjacent storage capacitors are isolated from each other.

8. The fabrication method of claim 7, wherein the stop layer includes a conductive material layer.

9. A fabrication method for a lower electrode of the capacitor, the method comprising:

providing a substrate with S/D regions formed therein and gates formed thereon;

forming landing pads on the substrate for connecting to the S/D regions, wherein the landing pads are located between the gates;

forming a bit line which connects to the landing pad;

forming a first dielectric layer for covering the bit line;

forming in sequence a stop layer, an insulating layer, and a mask layer on the first dielectric layer;

patterning the insulating layer and the mask layer, so that a capacitor opening is formed to expose the stop layer;

forming a spacer on a sidewall of the capacitor opening;

performing a self-aligned etching process to remove the stop layer and the first dielectric layer, with the mask layer and the spacer serving as an etching mask, so that a node contact opening which exposes the landing pad is formed, wherein the capacitor opening and the node contact opening forms a damascene contact opening, and sizes of the spacer and the capacitor opening determine a size of the node contact opening;

removing the mask layer and the spacer until the insulating layer is exposed;

forming a conformal conducting layer to cover the damascene contact opening; and removing the conducting layer above the insulating layer, and the insulating layer in sequence.

10. The fabrication method of claim 9, wherein the method for removing the conducting layer includes CMP.

11. The fabrication method of claim 9, wherein the method for forming the spacer includes deposition of a nitride layer for covering the mask layer and the exposed stop layer, followed by performing an etching back for forming the nitride spacer.

12. The fabrication method of claim 9, wherein the mask layer and the spacer are removed using a $H_3PO_4$ solution.

13. The fabrication method of claim 9, wherein the stop layer has a different etching rate from the insulating layer and the mask layer.

14. The fabrication method of claim 9, further comprises removing the insulating layer by etching using a buffer of etching (BOE) solution, with the stop layer serving as a protective layer.

15. The fabrication method of claim 9, further comprises removing the stop layer uncovered by the conducting layer, so that two adjacent storage capacitors are isolated from each other.

16. The fabrication method of claim 15, wherein the stop layer includes a conductive material layer.

17. The fabrication method of claim 9, further comprises forming a second dielectric layer that covers the S/D regions and the gates before formation of the landing pad.

18. The fabrication method of claim 9, further comprises forming a third dielectric layer that covers the landing pads and the second dielectric layer after formation of the landing pad.

\* \* \* \* \*